United States Patent
Wityak et al.

(10) Patent No.: US 9,035,448 B2
(45) Date of Patent: May 19, 2015

(54) SEMICONDUCTOR PACKAGES HAVING METAL COMPOSITE BASE PLATES

(71) Applicant: Materion Corporation, Mayfield Heights, OH (US)

(72) Inventors: George Michael Wityak, Albuquerque, NM (US); Richard Koba, Saugus, MA (US)

(73) Assignee: Materion Corporation, Mayfield Heights, OH (US)

( * ) Notice: Subject to any disclaimer, the term of this patent is extended or adjusted under 35 U.S.C. 154(b) by 0 days.

(21) Appl. No.: 13/930,105

(22) Filed: Jun. 28, 2013

(65) Prior Publication Data
US 2014/0001624 A1 Jan. 2, 2014

Related U.S. Application Data

(60) Provisional application No. 61/666,249, filed on Jun. 29, 2012.

(51) Int. Cl.
*H01L 23/34* (2006.01)
*H01L 23/373* (2006.01)
*H01L 23/495* (2006.01)

(52) U.S. Cl.
CPC ............ *H01L 23/3732* (2013.01); *H01L 23/34* (2013.01); *H01L 2924/0002* (2013.01); *H01L 23/3733* (2013.01); *H01L 23/3736* (2013.01); *H01L 23/49568* (2013.01); *H01L 23/49575* (2013.01); *H01L 23/49586* (2013.01)

(58) Field of Classification Search
USPC .......... 257/690, E23.111, 712, 666, 784, 786, 257/702, 703, 705, 675, 713, 717, 720
See application file for complete search history.

(56) References Cited

U.S. PATENT DOCUMENTS

| | | | | |
|---|---|---|---|---|
| 3,601,667 | A | * | 8/1971 | Desmond et al. ............. 257/671 |
| 3,601,737 | A | * | 8/1971 | Baird et al. .................... 337/159 |
| 3,742,599 | A | * | 7/1973 | Desmond et al. ............... 29/856 |
| 5,001,014 | A | * | 3/1991 | Charles et al. ................ 428/472 |
| 5,130,771 | A | | 7/1992 | Burnham |
| 5,625,332 | A | * | 4/1997 | Kamo et al. .................. 335/216 |
| 5,846,288 | A | * | 12/1998 | Jost et al. ........................ 75/252 |
| 6,211,463 | B1 | | 4/2001 | Fabis |
| 6,727,117 | B1 | | 4/2004 | McCoy |

(Continued)

OTHER PUBLICATIONS

International Search Report dated Nov. 22, 2013 in corresponding International Application No. PCT/US13/48462.

(Continued)

*Primary Examiner* — Alexander Oscar Williams
(74) *Attorney, Agent, or Firm* — Ohlandt, Greeley, Ruggiero & Perle, LLP

(57) ABSTRACT

Semiconductor packages are provided that have a base plate with a matrix of pure silver or a silver alloy and reinforcement particles. The reinforcement particles can include high thermal conductivity, low CTE particles selected from the group consisting of diamond, cubic boron nitride (c-BN), silicon carbide (SiC), and any combinations thereof. In some embodiments, the base plate is entirely comprised of the composite. In other embodiments, the base plate has a core made of the composite. The core can include at least one outer layer on the core. The semiconductor package can include one or more dice or transistors on the base plate, an insulated frame on the base plate, and one or more leads on the insulated frame.

32 Claims, 4 Drawing Sheets

(56) References Cited

U.S. PATENT DOCUMENTS

| | | | |
|---|---|---|---|
| 6,914,330 | B2 | 7/2005 | Kneringer |
| 7,067,903 | B2 | 6/2006 | Tachibana |
| 7,538,436 | B2* | 5/2009 | Gunturi et al. ............... 257/773 |
| 8,013,429 | B2 | 9/2011 | Mohammed |
| 8,018,051 | B2 | 9/2011 | Railkar |
| 2001/0038140 | A1* | 11/2001 | Karker et al. ............... 257/666 |
| 2004/0070070 | A1 | 4/2004 | Sung |
| 2004/0119161 | A1 | 6/2004 | Saito |
| 2005/0051891 | A1 | 3/2005 | Yoshida |
| 2009/0273077 | A1 | 11/2009 | Gektin |
| 2011/0012242 | A1 | 1/2011 | Mosher |
| 2011/0086218 | A9* | 4/2011 | Fukushima ............... 428/312.6 |
| 2014/0001628 | A1* | 1/2014 | Wityak et al. ............... 257/712 |
| 2014/0070397 | A1 | 3/2014 | Viswanathan |
| 2014/0072836 | A1* | 3/2014 | Mills ............... 429/8 |

OTHER PUBLICATIONS

Written Opinion dated Nov. 22, 2013 in corresponding International Application No. PCT/US13/48462.

Office Action from Applicant's co-pending U.S. Appl. No. 13/930,101 dated Oct. 7, 2014.

* cited by examiner

SEMICONDUCTOR PACKAGES HAVING METAL COMPOSITE BASE PLATES

CROSS REFERENCE TO RELATED APPLICATIONS

This application claims the benefit of U.S. Provisional Application Ser. No. 61/666,249, filed Jun. 29, 2012 the contents of which are incorporated by reference herein.

BACKGROUND OF THE INVENTION

1. Field of the Invention

The present disclosure is related to air cavity packages. More particularly, the present disclosure is related to air cavity packages having high thermal conductivity base plates and methods for making such base plates.

2. Description of Related Art

Semiconductor dice and transistors are often packaged or enclosed to protect the die or transistor from one or more environmental conditions.

One such package includes an air cavity package, which typically includes one or more semiconductor dice or transistors mounted directly on a base plate and an insulated frame surrounding the die or transistor. A lid is placed over the frame, sealing the die or transistor in a cavity of air. In addition to the structural aspect of the base plate for mounting the dice and transistors, the base plate is used to assist in removing heat from the die or transistor by conduction.

Air cavity packages are widely used to house high frequency devices such as radio-frequency or RF dice and transistors. The power densities of such dice and transistors continue to increase. Thus, it has been determined by the present disclosure that there is a need for increases in the heat dissipating capacity of packages, particularly of base plates.

In use, air cavity packages undergo numerous high temperature heat cycles. Thus, in addition to having a high heat dissipating capacity, the base plates must also have a coefficient of thermal expansion (CTE) that matches those of the die or transistor and the frame. Minimizing CTE mismatch among the package components is desired to mitigate failure and fatigue of the components that can result from temperature cycling.

Accordingly, there is a continuing need for air cavity packages and base plates that overcome, alleviate, and/or mitigate one or more of the aforementioned and other deleterious effects of prior art packages.

SUMMARY

A base plate is provided that has a high thermal conductivity. In some embodiments, the base plate is made of reinforced silver composite. The composite can include a matrix of pure silver or a silver alloy and reinforcement particles. The reinforcement particles can include high thermal conductivity, low CTE particles selected from the group consisting of diamond, cubic boron nitride (c-BN), silicon carbide (SiC), and any combinations thereof.

A semiconductor package is provided that includes a base plate that is at least partially comprised of a composite made of silver-diamond or a silver alloy-diamond. In some embodiments, the base plate is entirely comprised of the composite. In other embodiments, the base plate has a core made of the composite. The core can include at least one outer layer on the core.

The semiconductor package can include one or more dice or transistors on the base plate, an insulated frame on the base plate, and one or more leads on the insulated frame.

The above-described and other features and advantages of the present disclosure will be appreciated and understood by those skilled in the art from the following detailed description, drawings, and appended claims.

DETAILED DESCRIPTION OF THE INVENTION

Figure 1:
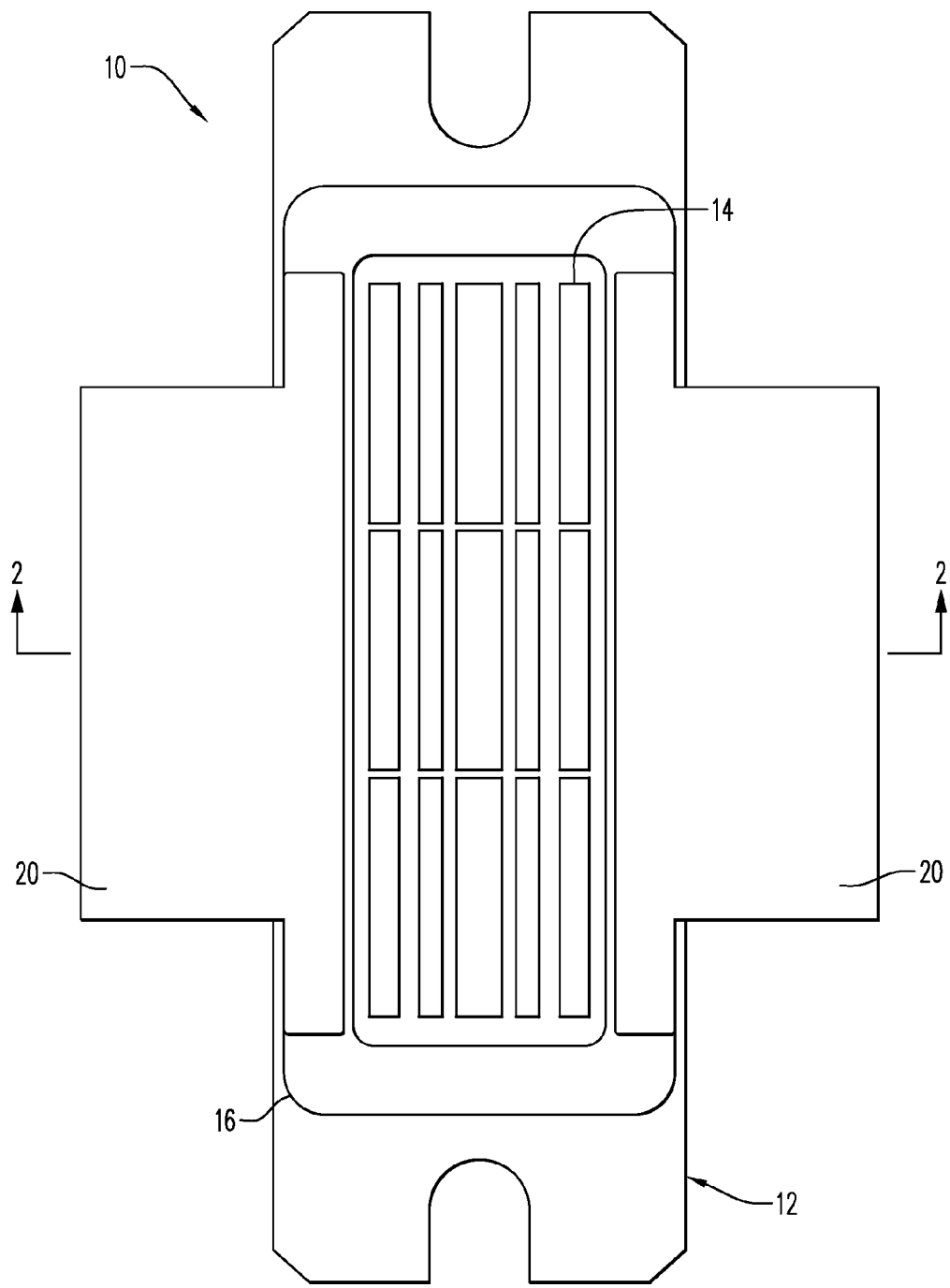
FIG. 1 is a plan view of an exemplary embodiment of an air cavity package according to the present disclosure.
Figure 2:
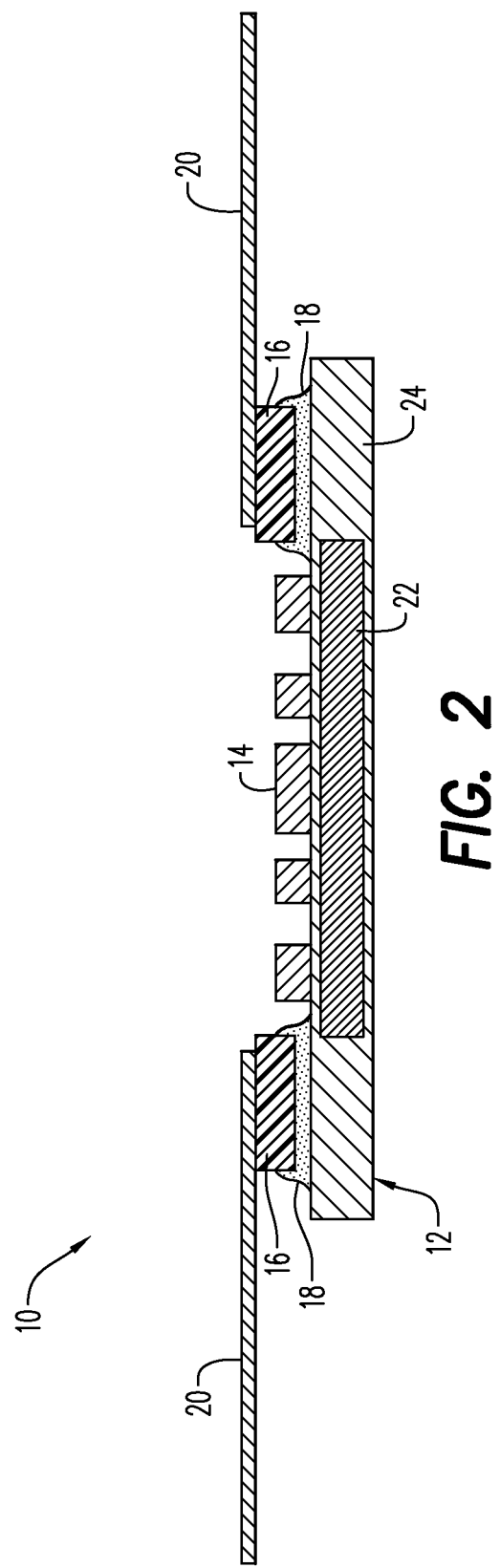
FIG. 2 is a sectional view of the air cavity package of FIG. 1 taken along line 2-2.
Figure 3:
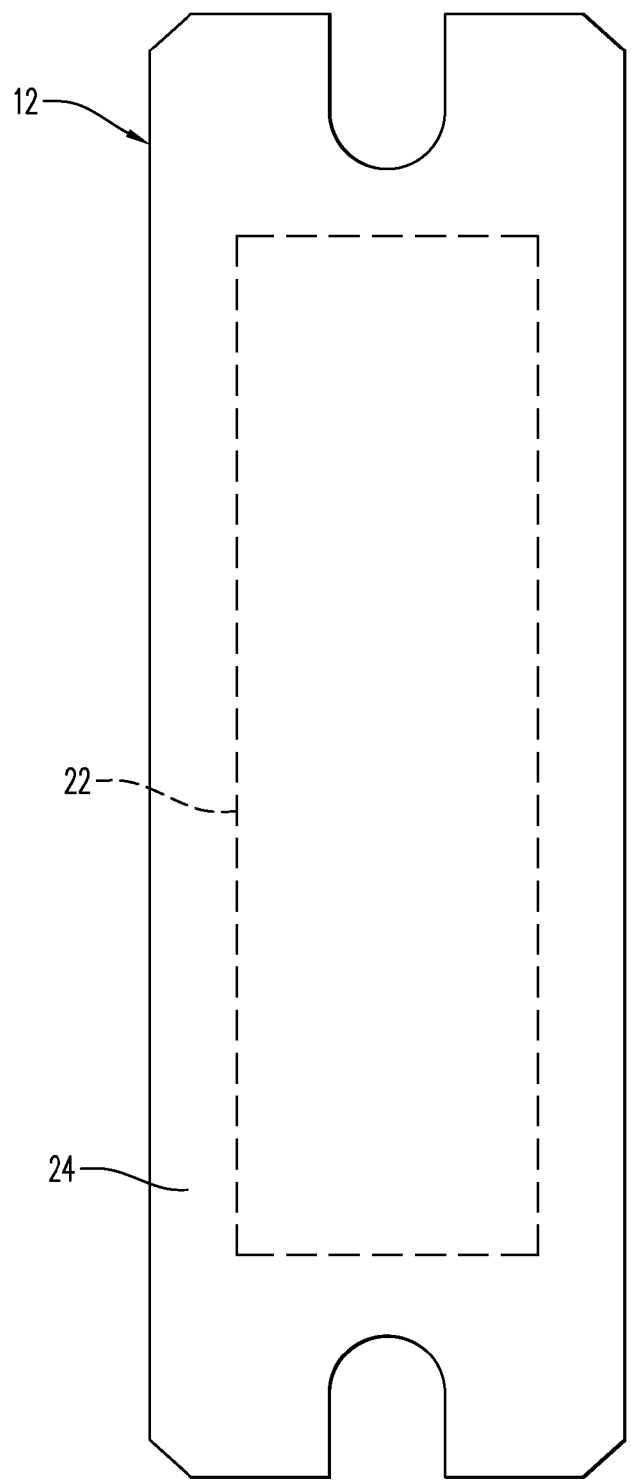
FIG. 3 is a plan view of an exemplary embodiment of a base plate according to the present disclosure for use in the air cavity package of FIG. 1.

Referring to the drawings and in particular to FIGS. 1 through 3, an exemplary embodiment of an air cavity package according to the present disclosure is shown and is generally referred to by reference numeral 10. Advantageously, package 10 includes a base plate 12 having a high thermal capacity, which is made at least partially of reinforced silver composite.

Package 10 is shown prior to assembly of a lid (not shown). Package 10 includes base plate 12, one or more dice or transistors 14, and an insulated frame 16. Frame 16 is secured to base plate 12 by a securing material 18. Securing material 18 can be any desired securing material such as, but not limited to, a cured epoxy, a braze, an adhesive, or any other securing material. Insulated frame 16 generally surrounds the dice or transistors 14 and has one or more conductive leads 20 thereon for electrical communication with the dice or transistors 14 by way of one or more wire leads (not shown).

Dice or transistors 14 can include, but are not limited to, laterally diffused metal oxide semiconductor (LDMOS) dice, field effect transistors (FET), and high electron mobility transistors (HEMT), and other active semiconductor devices. The semiconductor device can include devices made of Si, GaAs, SiC, GaN and alloys based upon GaN. Additionally, dice or transistors 14 can also include passive devices such as, but not limited to, resistors, terminators, attenuators, and capacitors.

Base plate 12 includes a core 22 having a high thermal conductivity, namely a thermal conductivity of at least 400 watts per meter Kelvin (W/m-K) at 20 degrees Celsius (° C.), preferably at least 500 W/m-K at 20° C. Core 22 is made of a composite comprised of a matrix of pure silver or a silver alloy and reinforcement particles. The reinforcement particles include diamond, c-BN, SiC, and any combinations thereof. Core 22 acts as a heat spreader and provide improved heat removal and low thermal expansion, as well as an electrical connection for the die.

In some embodiments, base plate 12 can further include one or more outer layers 24 surrounding core 22. Layer 24 can be made of any conductive material such as, but not limited to, copper, silver, nickel, CuAg, CuAg eutectic, gold, platinum, palladium, silver/tungsten, CuMo composite, or W, Mo, Kovar and any combinations or alloys thereof. Preferably, layer 24 is made of gold or silver. In some embodiments, the CuAg eutectic can have a composition of less than 100% weight percent Ag to more than 50% weight percent Ag and any subranges therebetween. In one exemplary embodiment, the CuAg eutectic has a composition of about 72% weight percent Ag and about 28% weight percent Cu.

Thus, base plate 12 may be entirely comprised of the composite or the base plate may include core 22 made of the composite surrounded by one or more layers 24.

The composite of the present disclosure is comprised of particles of diamond, c-BN, SiC and combinations thereof particles within a silver or a silver alloy matrix. In some embodiments, the diamond particles may be augmented by additional of high thermal conductivity graphite fibers, carbon nanotubes, graphene, c-BN, SiC and any combinations thereof.

In some embodiments having core 22, the layers 24 are thin layers applied to the core, where the core itself is configured in the desired shape of base plate 12 with the layers merely adding a thin electrically conductive skin to the core.

In other embodiments having core 22, the core is configured in a shape corresponding to the region of base plate 12 that receives dice or transistors 14 and the layers 24 form the remaining sections of the base plate as seen in FIG. 3.

Figure 4:
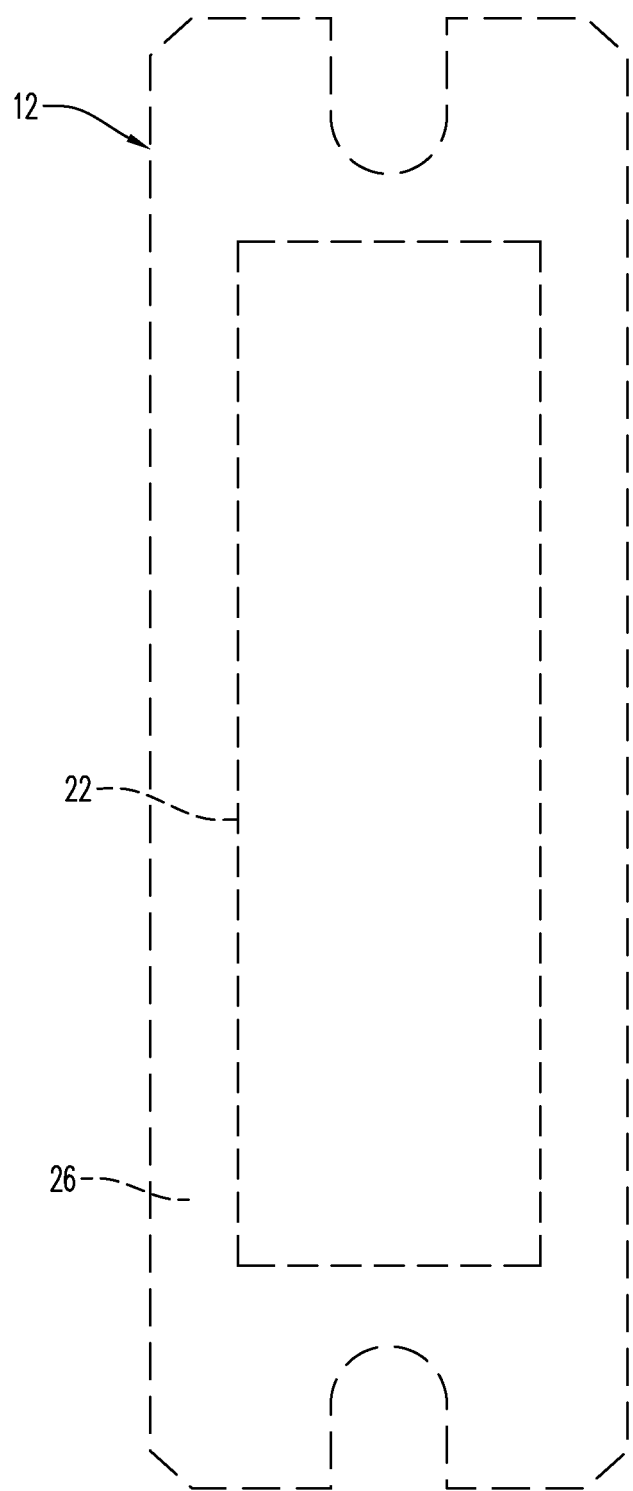
FIG. 4 is a plan view of an exemplary embodiment of a pair of cores according to the present disclosure for use in the air cavity package of FIG. 1.

It is further contemplated by the present disclosure for base plate 12 to include an outer region 26 as seen in FIG. 4. Here, core 22 is in the region of base plate 12 that receives dice or transistors 14 and is formed of the composite of the present disclosure, while outer region 26 forms the remaining regions of the base plate and can be formed of a different material.

For example, outer region 26 can be formed of the composite of the present disclosure or can be formed of any other thermally conductive material such as, but not limited to, copper, silver, CuAg, CuAg eutectic, gold, platinum, palladium, silver/tungsten, CuMo composite, or W, Mo, Kovar and any combinations or alloys thereof. Although not illustrated in FIG. 4, it is further contemplated by the present disclosure for this embodiment to include one or more layers 24 covering and securing the core 22 and outer region 26.

In one particular embodiment, core 22 is formed of the composite having the silver-diamond or silver alloy-diamond, while outer region 26 is a single continuous phase of the silver or silver alloy used in the formation of core 22 but without the diamond. It is contemplated for this embodiment to optionally include one or more layers 24.

Without wishing to be bound by any particular theory, it is believed by the present disclosure that silver, which has a low oxygen content, has a very high affinity for oxygen in the molten state, which has been found to act as a positive factor for binding with diamond.

Thus in one embodiment, the composite of the present disclosure is formed by mixing diamond particles with molten silver, which has a low oxygen content, to provide the desired silver-diamond composite with a very high adhesion between the silver and the diamond. As used herein, the term low oxygen content silver shall mean silver having less than 300 parts per million (ppm) of oxygen, with less than 200 ppm being preferred, and less than 100 ppm being most preferred. In one particular embodiment of the present disclosure, silver or silver alloy having less than 50 ppm oxygen is used.

In some embodiments, the composite includes a further adhesion promoter coated on the diamond particles and, when present, conductivity graphite fibers, carbon nanotubes, graphene, and any combinations thereof.

For example, it is contemplated by the present disclosure for the diamond or other particles to be coated with an oxide such as but not limited to, $TiO_2$. The oxide coated diamond and other particles, when present, are then combined with molten silver, which has a low oxygen content, to provide the desired silver-diamond composite with a very high adhesion between the silver and the diamond.

It is also contemplated by the present disclosure for the diamond or other particles to be coated with one or more layers of Cr, W, Mo, Co, Cu, Ti, Si, SiC, TiN, TiC, Ta, Zr, and any combinations thereof.

Moreover, it has been found by the present disclosure that silver alloys well with copper, zinc, tin, indium, bismuth and has limited or no solubility with refractory metals such as tungsten and molybdenum. Thus, the composite of the present disclosure is not limited to silver-diamond either in the coated or uncoated form, but can also include silver-alloy-diamond composites such as, but not limited to CuAg-diamond, AgCuSn-diamond, and InCuAg-diamond, where the diamond can be in coated or uncoated form. In some embodiments, the silver alloy can be CuAg eutectic.

The silver-diamond or silver alloy-diamond composite of the present disclosure advantageously provides superior reflectance of infrared radiation. Thus, base plate 12 can, in some embodiments, provide a reflectivity of 95%-99% in the visible spectrum.

In a method of making the silver-diamond composite, diamond particles and other particles when present, in either coated or uncoated form are mixed with a dry-processing binder and compacted in a die under pressure to form a compacted body. The compacted body of particles can be heated to evaporate or decompose at least part of the binder and/or cause bonding or partial sintering of the particles.

The compacted body and low oxygen silver or silver alloy are then heated to melt and draw the silver into the bonded or partially sintered diamond particles. The composite is then cooled and cut to the desired shape of base plate 12 or core 22. The hot molten silver can be drawn into the bonded particles using a gravity feed, vacuum enhanced gravity feed, vacuum casting, pressure casting, isostatic pressure, metal injection molding, and centrifugal casting.

When base plate 12 further includes outer layer 24, core 22 can be coated with one or more of the layers of desired material. When base plate 12 further includes additional cores, core 22 and the additional cores can be coated with one or more layers 24 of desired material.

It should also be noted that the terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the present disclosure.

What is claimed is:

1. A semiconductor package comprising a base plate at least partially comprised of a metal matrix composite comprised of high thermal conductivity, low thermal expansion particles in a matrix of silver, wherein the metal matrix composite is formed by mixing the high thermal conductivity, low thermal expansion particles with molten silver that has an oxygen content of less than 300 parts per million.

2. The semiconductor package of claim 1, wherein the silver comprises a silver alloy.

3. The semiconductor package of claim 2, wherein the silver alloy is CuAg eutectic.

4. The semiconductor package of claim 1, wherein the high thermal conductivity, low thermal expansion particles are selected from the group consisting of diamond, cubic boron nitride, silicon carbide, and any combinations thereof.

5. The semiconductor package of claim 1, wherein the base plate is entirely comprised of the composite.

6. The semiconductor package of claim 1, wherein the base plate comprises a core made of the composite and at least one outer layer on the core.

7. The semiconductor package of claim 6, further comprising one or more dice or transistors mounted on the at least one outer layer.

8. The semiconductor package of claim 7, wherein the core is formed only in the region of the one or more dice or transistors.

9. The semiconductor package of claim 1, wherein the base plate comprises a core made of the composite.

10. The semiconductor package of claim 8, further comprising an outer region surrounding the core.

11. The semiconductor package of claim 9, further comprising at least one outer layer on the core and the outer region.

12. The semiconductor package of claim 9, wherein the outer region is a continuous phase of the silver or silver alloy of the core.

13. The semiconductor package of claim 9, wherein the silver comprises a silver alloy and the outer region is a continuous phase of the silver alloy.

14. The semiconductor package of claim 1, further comprising one or more dice or transistors mounted on the base plate.

15. The semiconductor package of claim 14, further comprising an insulated frame mounted on the base plate around the one or more dice or transistors.

16. The semiconductor package of claim 15, further comprising one or more conductive leads on the insulated frame.

17. The semiconductor package of claim 1, further comprising an insulated frame mounted on the base plate.

18. The semiconductor package of claim 17, further comprising one or more conductive leads on the insulated frame.

19. The semiconductor package of claim 4, wherein the high thermal conductivity, low thermal expansion particles are coated with one or more layers selected from the group consisting of Cr, W, Mo, Co, Cu, Ti, Si, SiC, TiN, TiC, Ta, Zr, and any combinations thereof.

20. A semiconductor package comprising a baseplate at least partially formed of a metal matrix composite consisting essentially of CuAg eutectic and molybdenum coated diamond.

21. The semiconductor package of claim 20, wherein the base plate is entirely comprised of the composite.

22. The semiconductor package of claim 20, wherein the base plate comprises a core made of the composite and at least one outer layer on the core.

23. The semiconductor package of claim 22, wherein the core is formed only in a dice or transistor mounting region.

24. The semiconductor package of claim 20, wherein the base plate comprises a core made of the composite formed only in a dice or transistor mounting region and an outer region surrounding the core.

25. The semiconductor package of claim 24, further comprising at least one outer layer on the core and the outer region.

26. The semiconductor package of claim 24, wherein the outer region is a continuous phase of the CuAg eutectic.

27. The semiconductor package of claim 20, further comprising an insulated frame mounted on the base plate around a dice or transistor mounting region.

28. The semiconductor package of claim 27, further comprising one or more conductive leads on the insulated frame.

29. The semiconductor package of claim 1, wherein the metal matrix composite is formed by mixing the high thermal conductivity, low thermal expansion particles with molten silver that has an oxygen content of less than 100 parts per million.

30. The semiconductor package of claim 1, wherein the metal matrix composite is formed by mixing the high thermal conductivity, low thermal expansion particles with molten silver that has an oxygen content of less than 50 parts per million.

31. The semiconductor package of claim 20, wherein the metal matrix composite is formed by mixing the molybdenum coated diamond with CuAg eutectic that has an oxygen content of less than 300 parts per million.

32. The semiconductor package of claim 20, wherein the metal matrix composite is formed by mixing the molybdenum coated diamond with CuAg eutectic that has an oxygen content of less than 50 parts per million.

* * * * *